United States Patent
Cui et al.

(10) Patent No.: US 11,527,286 B2
(45) Date of Patent: *Dec. 13, 2022

(54) VOLTAGE DRIVERS WITH REDUCED POWER CONSUMPTION DURING POLARITY TRANSITION

(71) Applicant: Micron Technology, Inc., Boise, ID (US)

(72) Inventors: Mingdong Cui, Folsom, CA (US); Nathan Joseph Sirocka, Loomis, CA (US); Hari Giduturi, Folsom, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/375,441

(22) Filed: Jul. 14, 2021

(65) Prior Publication Data

US 2021/0343340 A1 Nov. 4, 2021

Related U.S. Application Data

(63) Continuation of application No. 16/660,594, filed on Oct. 22, 2019, now Pat. No. 11,087,838.

(51) Int. Cl.
*G11C 7/12* (2006.01)
*G11C 8/08* (2006.01)
*G11C 13/00* (2006.01)

(52) U.S. Cl.
CPC ............ *G11C 13/0038* (2013.01); *G11C 7/12* (2013.01); *G11C 8/08* (2013.01); *G11C 13/003* (2013.01); *G11C 13/004* (2013.01); *G11C 13/0026* (2013.01); *G11C 13/0028* (2013.01); *G11C 2013/0045* (2013.01); *G11C 2213/71* (2013.01)

(58) Field of Classification Search
CPC ......... G11C 13/0038; G11C 7/12; G11C 8/08; G11C 13/0026; G11C 13/0028; G11C 13/003; G11C 13/004; G11C 2013/0045; G11C 2213/71; G11C 13/0069; G11C 5/145

See application file for complete search history.

(56) References Cited

U.S. PATENT DOCUMENTS

| | | |
|---|---|---|
| 4,535,259 A | 8/1985 | Smarandoiu et al. |
| 6,028,813 A | 2/2000 | Choi |
| 8,737,137 B1 * | 5/2014 | Choy ..................... G11C 16/08 365/185.23 |
| 10,157,671 B1 | 12/2018 | Lung et al. |
| 11,087,838 B2 | 8/2021 | Cui et al. |

(Continued)

*Primary Examiner* — Jay W. Radke
(74) *Attorney, Agent, or Firm* — Greenberg Traurig

(57) ABSTRACT

An integrated circuit memory device having: a memory cell; and a voltage driver of depletion type connected to the memory cell. In a first polarity, the voltage driver is powered by a negative voltage relative to ground to drive a negative selection voltage or a first de-selection voltage; In a second polarity, the voltage driver is powered by a positive voltage relative to ground to drive a positive selection voltage or a second de-selection voltage. The voltage driver is configured to transition between the first polarity and the second polarity. During the transition, the voltage driver is configured to have a control voltage swing for outputting de-selection voltages smaller than a control voltage swing for output selection voltages.

20 Claims, 3 Drawing Sheets

(56) References Cited

U.S. PATENT DOCUMENTS

2007/0030738 A1    2/2007   Oh
2011/0149675 A1    6/2011   Chang et al.
2021/0118501 A1    4/2021   Cui et al.

* cited by examiner

VOLTAGE DRIVERS WITH REDUCED POWER CONSUMPTION DURING POLARITY TRANSITION

RELATED APPLICATIONS

The present application is a continuation application of U.S. patent application Ser. No. 16/660,594, filed Oct. 22, 2019 and entitled "Voltage Drivers with Reduced Power Consumption during Polarity Transition", the entire disclosure of which is hereby incorporated herein by reference.

FIELD OF THE TECHNOLOGY

At least some embodiments disclosed herein relate to voltage drivers for applying voltages to memory cells in general and more particularly, but not limited to, energy efficient voltage drivers for voltages involving polarity transition.

BACKGROUND

A memory integrated circuit can have one or more arrays of memory cells formed on an integrated circuit die of semiconducting material. A memory cell is a smallest unit of memory that can be individually used or operated upon to store data. In general, a memory cell can store one or more bits of data.

Different types of memory cells have been developed for memory integrated circuits, such as random access memory (RAM), read-only memory (ROM), dynamic random access memory (DRAM), static random access memory (SRAM), synchronous dynamic random access memory (SDRAM), phase change memory (PCM), magneto random access memory (MRAM), negative-or (NOR) flash memory, electrically erasable programmable read-only memory (EEPROM), flash memory, etc.

Some integrated circuit memory cells are volatile and require power to maintain data stored in the cells. Examples of volatile memory include Dynamic Random-Access Memory (DRAM) and Static Random-Access Memory (SRAM).

Some integrated circuit memory cells are non-volatile and can retain stored data even when not powered. Examples of non-volatile memory include flash memory, Read-Only Memory (ROM), Programmable Read-Only Memory (PROM), Erasable Programmable Read-Only Memory (EPROM) and Electronically Erasable Programmable Read-Only Memory (EEPROM) memory, etc. Flash memory includes negative-and (NAND) type flash memory or a negative-or (NOR) type flash memory. A NAND memory cell is based on a NAND logic gate; and a NOR memory cell is based on a NOR logic gate.

Cross-point memory (e.g., 3D XPoint memory) uses an array of non-volatile memory cells. The memory cells in cross-point memory are transistor-less. Each of such memory cells can have a phase-change memory device and a select device that are stacked together as a column in an integrated circuit. Memory cells of such columns are connected in the integrated circuit via two layers of wires running in directions that are perpendicular to each other. One of the two layers is above the memory cells; and the other layer is below the memory element columns. Thus, each memory cell can be individually selected at a cross point of one wire on each of the two layers. Cross point memory devices are fast and non-volatile and can be used as a unified memory pool for processing and storage.

A non-volatile integrated circuit memory cell can be programmed to store data by applying one voltage or a pattern of voltage to the memory cell during a program/write operation. The program/write operation sets the memory cell in a state that corresponds to the data being programmed/stored into the memory cell. The data stored in the memory cell can be retrieved in a read operation by examining the state of the memory cell. The read operation determines the state of the memory cell by applying a voltage and determine whether the memory cell becomes conductive at a voltage corresponding to a pre-defined state.

BRIEF DESCRIPTION OF THE DRAWINGS

The embodiments are illustrated by way of example and not limitation in the figures of the accompanying drawings in which like references indicate similar elements.

DETAILED DESCRIPTION

At least some embodiments disclosed herein provide systems, methods and apparatus to drive voltages with polarity transition at low energy consumption.

In some implementations, cross point memory can use a memory cell that has a select device but no phase-change memory device. For example, the memory cell can be a single piece of alloy with variable threshold capability. The read/write operations of such a cell can be based on thresholding the cell while inhibiting other cells in subthreshold bias, in a way similar to the read/write operations for a memory cell having a select device and a phase-change memory device that are stacked together as a column.

Such a memory cell, having a select device but no phase-change memory device, can be programmed in cross point memory to have a threshold voltage window. The threshold voltage window can be created by applying programming pulses with opposite polarity to the select device. For example, the select device can be biased to have a positive voltage difference between two sides of the select device and alternatively, to have a negative voltage difference between the same two sides of the select device. When the positive voltage difference is considered in positive polarity, the negative voltage difference is considered in negative polarity that is opposite to the positive polarity. Reading can be performed with a given/fixed polarity. When programmed (e.g., in the same direction/polarity as for read operations), the memory cell has a threshold lower than the cell that has been reset, such that during a read operation, the read voltage can cause a programmed cell to become conductive while a reset cell remains non-conductive.

To drive programming pulses with opposite polarity, a voltage driver experiences a voltage swing that consumes energy. Voltage drivers operating deselected wordline/bitline consume most energy. At least some embodiments discussed below provides a voltage driver of depletion type configuration that reduces the energy consumed during the voltage swing for polarity transition.

Figure 1:
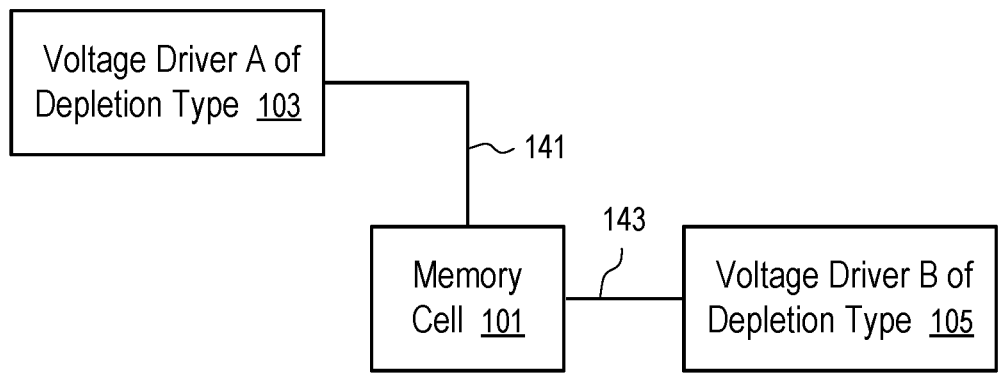
FIG. 1 shows the use of voltage drivers of depletion type to drive voltages involving polarity transition in a memory cell according to some embodiments.

FIG. 1 shows the use of voltage drivers (103 and 105) of depletion type to drive voltages involving polarity transition in a memory cell (101) according to some embodiments.

In FIG. 1, the voltage drivers (103 and 105) are configured to drive the voltages applied on the memory cell (101) during a write operation that programs data into the memory cell (101).

The memory cell (101) has a select device but no phase-change memory device. A wire (141) is connected to one side of the memory cell (101); and another wire (143) is connected to the side of the memory cell (101).

When applying voltages of positive polarity to the memory cell (101), the voltage driver B (105) can apply a high positive selection voltage (e.g., 4V) on the wire (143), while the voltage driver A (103) can apply a high negative selection voltage (e.g., −4V) on the wire (141).

When applying voltages of negative polarity to the memory cell (101), the voltage driver B (105) can apply a high negative selection voltage (e.g., −4V) on the wire (143), while the voltage driver A (103) can apply a high positive selection voltage (e.g., 4V) on the wire (141).

When the voltage driver A (103) and/or the voltage driver B (105) drives a low de-selection voltage (e.g., 0V), the memory cell (101) is not selected. When both the voltage driver A (103) and the voltage driver B (105) drive high selection voltages (e.g., −4V and 4V), the memory cell (101) is selected.

Preferably, the voltage driver A (103) and/or the voltage driver B (105) are of depletion type configured according to FIGS. 2-5 to output selection/de-selection voltages to reduce power consumption.

FIGS. 2-5 shows a voltage driver (107) of depletion type configured for driving voltages of different polarities according to one embodiment. For example, the voltage driver (107) can be used to implement the voltage drivers (103 and 105) in FIG.

Figure 2:
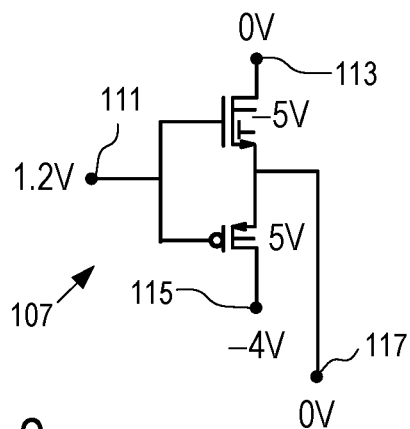
FIGS. 2-5 shows a voltage driver of depletion type configured for driving voltages of different polarities according to one embodiment.
Figure 3:
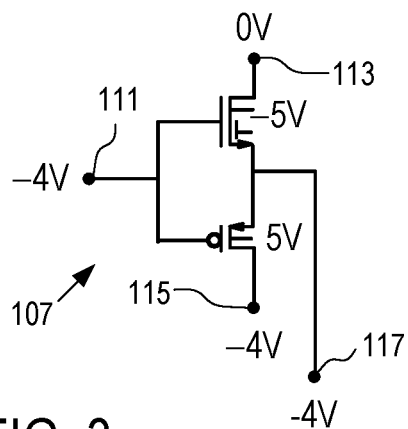

In FIGS. 2 and 3, the voltage driver (107) is powered by a negative voltage (e.g., −4V) relative to ground (e.g., 0V) between voltage lines (113 and 115) to drive negative voltages. For example, a voltage of 0V is applied to the voltage line (113); and a voltage of −4V is applied to the voltage line (115). When the control line (111) receives a voltage of 1.2V in FIG. 2, the output line (117) of the voltage driver (107) provides a de-selection signal of 0V. When the control line (111) receives a control voltage of −4V in FIG. 3, the output line (117) of the voltage driver (107) provides a selection signal of negative polarity at −4V.

Figure 4:
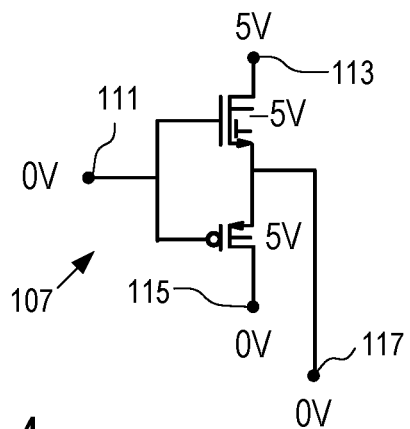
Figure 5:
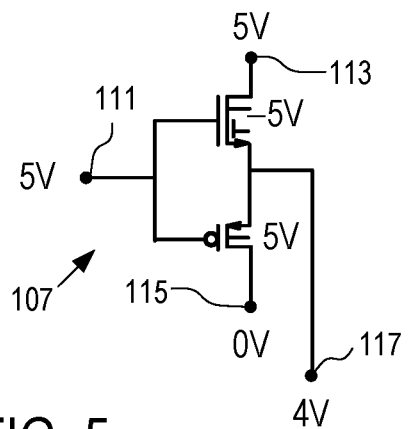

In FIGS. 4 and 5, the voltage driver (107) is powered by a positive voltage (e.g., 5V) relative to ground (e.g., 0V) between voltage lines (113 and 115) to drive positive voltages. For example, a voltage of 5V is applied to the voltage line (113); and a voltage of 0V is applied to the voltage line (115). When the control line (111) receives a control voltage of 0V in FIG. 4, the output line (117) of the voltage driver (107) provides a de-selection signal of 0V. When the control line (111) receives a control voltage of 5V in FIG. 5, the output line (117) of the voltage driver (107) provides a selection signal of positive polarity at 4V.

When the voltage driver (107) configured according to FIGS. 2-5 is used, the control line (111) of the voltage driver (107) experiences a control voltage swing of 1.2V between the configurations of FIGS. 2 and 4 for driving de-selection voltages. Such a transition can consume about 2 to 3 pJ of energy per polarity transition.

In contrast, if a voltage driver of inverter type is used, the voltage driver can experience a voltage swing of 9V for a polarity transition for driving a de-selection signal. Such a transition in a voltage driver of inverter type can consume more than 120 pJ of energy per transition. In FIGS. 3 and 5, the control line (111) of the voltage driver (107) experiences a control voltage swing of 9V for driving selection voltages during polarity transition.

Typically, when addressing an array of memory cells, there are more voltage drivers driving de-selection signals than voltage drivers driving selection signals. Thus, the use of a voltage driver (107) of depletion type according to the configurations illustrated in FIGS. 2-5 can lead to significant reduction in energy consumption in a memory device having an array of memory cells (e.g., 101).

Figure 6:
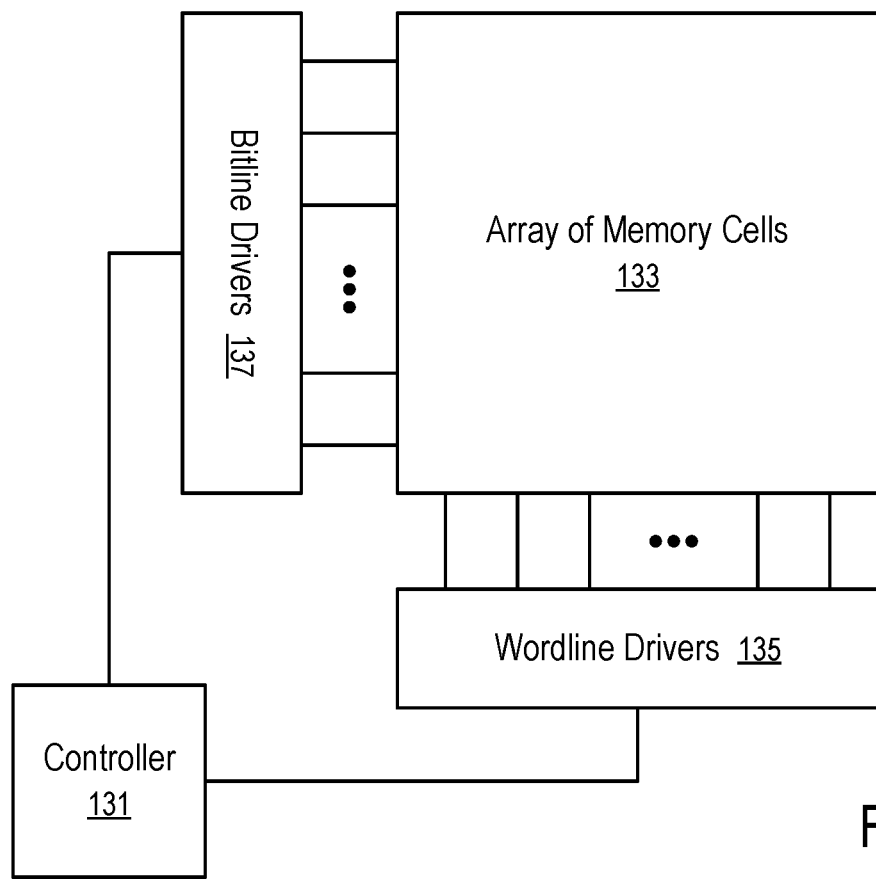
FIG. 6 shows a memory device configured with drivers of depletion type according to one embodiment.

FIG. 6 shows a memory device configured with drivers of depletion type according to one embodiment.

In FIG. 6, the memory device includes an array (133) of memory cells. For example, a memory cell (101) illustrated in FIG. 1 can be used in the memory cell array (133).

The memory device of FIG. 6 includes a controller (131) that operates bitline drivers (137) and wordline drivers (135) to access the individual memory cells (e.g., 101) in the array (133).

The bitline drivers (137) and/or the wordline drivers (135) can include a voltage driver (107) configured according to FIGS. 2-5 to reduce energy consumption during polarity transition.

Figure 7:
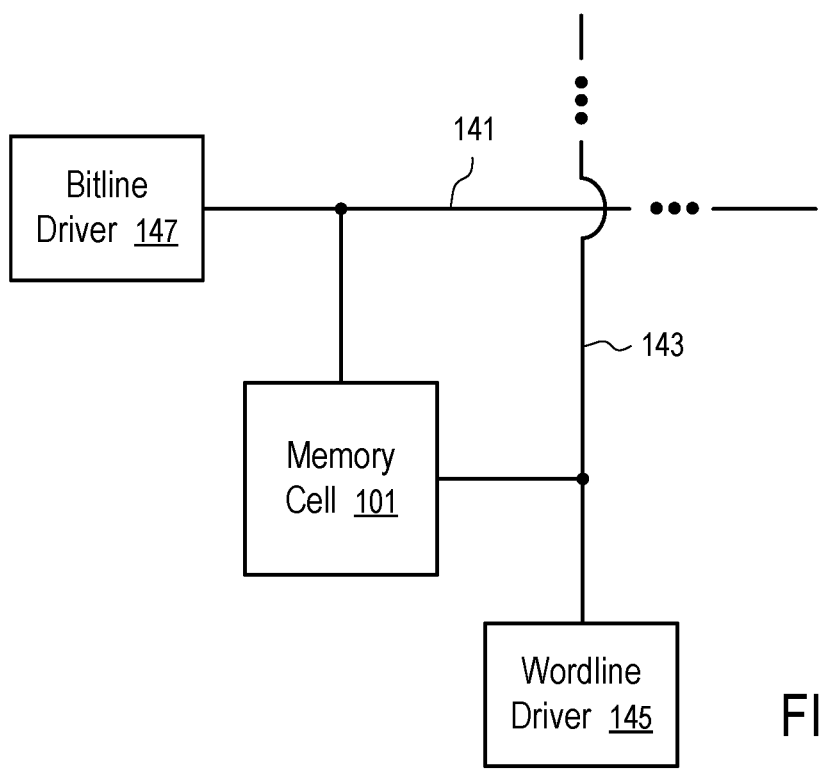
FIG. 7 shows a memory cell with a bitline driver and a wordline driver configured to reduce power consumption according to one embodiment.

For example, each memory cell (e.g., 101) in the array (133) can be accessed via voltages driven by a pair of a bitline driver and a wordline driver, as illustrated in FIG. 7.

FIG. 7 shows a memory cell (101) with a bitline driver (147) and a wordline driver (145) configured to reduce power consumption according to one embodiment.

For example, the bitline driver (147) drives a first voltage applied to a row of memory cells in the array (133); and the wordline driver (145) drives a second voltage applied to a column of memory cells in the array (133). A memory cell (101) in the row and column of the memory cell array (133) is subjected to the voltage difference between the first voltage driven by the bitline driver (147) and the second voltage driven by the wordline driver (145). When the first voltage is higher than the second voltage, the memory cell (101) is subjected to one voltage polarity (e.g., positive polarity); and when the first voltage is lower than the second voltage, the memory cell (101) is subjected to an opposite voltage polarity (e.g., negative polarity).

At least one of the bitline driver (147) and the wordline driver (145) can be configured as a driver (107) of depletion type in a way illustrated in FIGS. 2-5.

For example, when the memory cell (101) is to be selected, the bitline driver (147) drives a positive high voltage (e.g., 4V) according to FIG. 5 in one polarity and a negative high voltage (e.g., −4V) according to FIG. 3 in the opposite polarity. Similarly, the wordline driver (145) drives a negative high voltage (e.g., −4V) according to FIG. 3 in one polarity and a positive high voltage (e.g., 4V) according to FIG. 5 in the opposite polarity.

For example, when the memory cell (101) is to be de-selected, the bitline driver (147) drives a low voltage (e.g., 0V) according to FIG. 4 in one polarity and a low voltage (e.g., 0V) according to FIG. 2 in the opposite polarity. When the bitline driver (147) drives a low voltage, the wordline driver (145) may drive a high voltage according to FIGS. 3 and 5, or drive a low voltage according to FIGS. 2 and 4.

Similarly, when the memory cell (101) is to be de-selected, the wordline driver (145) drives a low voltage (e.g., 0V) according to FIG. 2 in one polarity and a low voltage (e.g., 0V) according to FIG. 4 in the opposite polarity. When the wordline driver (145) drives a low voltage, the bitline driver (147) may drive a high voltage according to FIGS. 3 and 5, or drive a low voltage according to FIGS. 2 and 4.

For example, the bitline drivers (137) can be used to drive parallel wires (e.g., 141) arranged in one direction and disposed in one layer of cross point memory; and the wordline drivers (135) can be used to drive parallel wires (e.g., 143) arranged in another direction and disposed in another layer of the cross point memory. The wires (e.g., 141) connected to the bitline drivers (e.g., 147) and the wires (e.g., 143) connected to the wordline drivers (e.g., 145) run in the two layers in orthogonal directions. The memory cell array (133) is sandwiched between the two layers of wires; and a memory cell (e.g., 101) in the array (133) is formed at a cross point of the two wires (e.g., 141 and 143) in the integrated circuit die of the cross point memory.

Figure 8:
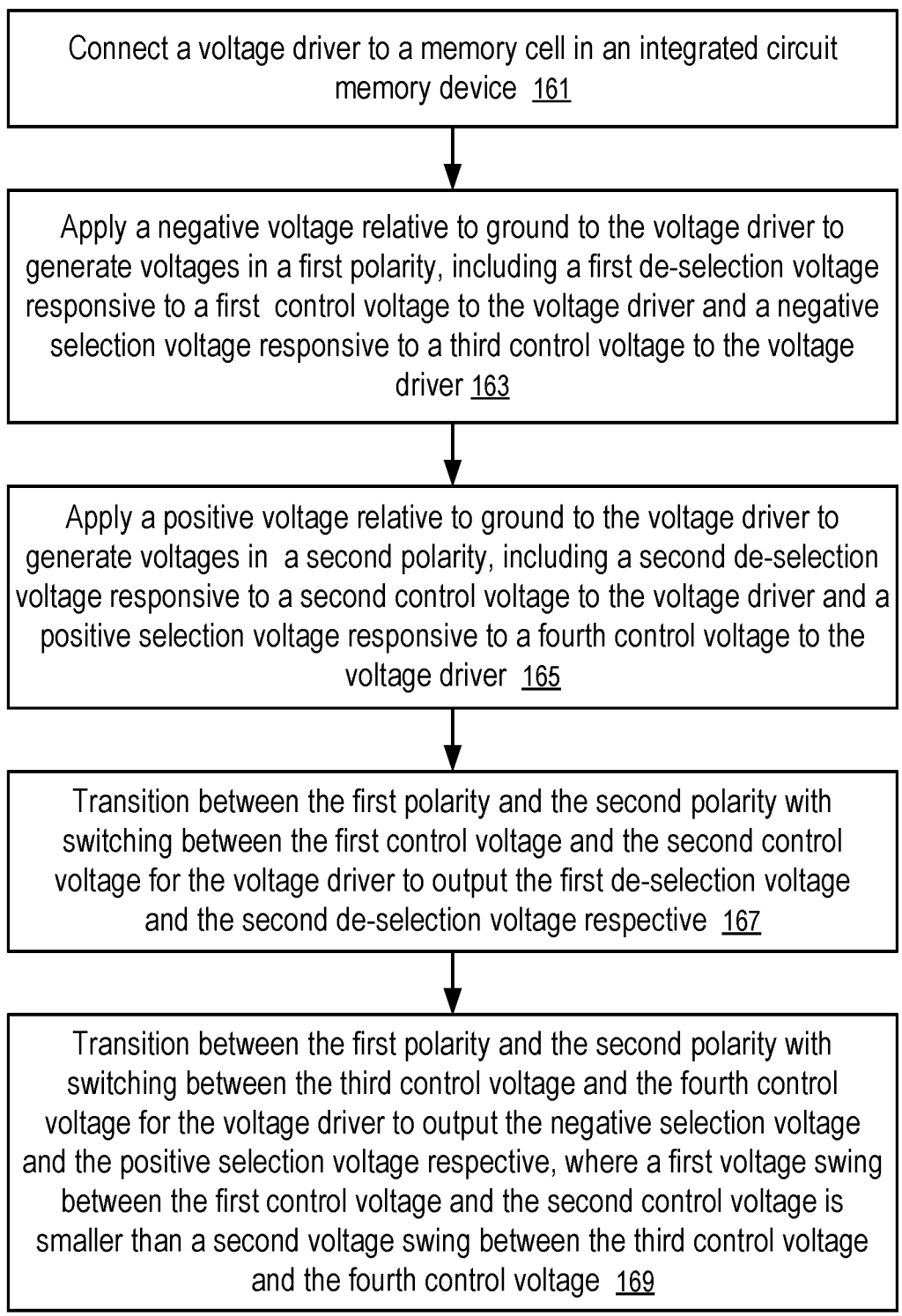
FIG. 8 shows a method to apply voltages on a memory cell according to one embodiment.

FIG. 8 shows a method to apply voltages on a memory cell according to one embodiment. For example, the method of FIG. 8 can be implemented in a memory device of FIG. 6 using voltage drivers (e.g., 107) of depletion type configured according to FIGS. 1-5.

At block 161, a voltage driver (107) is connected to a memory cell (101) in an integrated circuit memory device.

For example, the integrated circuit memory device can include cross point memory containing the memory cell (101). For example, the memory cell (101) can include a select device but no phase-change memory device; and the memory cell (101) is programmable to store data via applying pulses with opposite polarity. During the operation to read the memory cell, voltages of a predetermined, fixed polarity are applied to the memory cell.

At block 163, a negative voltage relative to ground is applied to the voltage driver (107). When powered by the negative voltage (e.g., between 0V and −4V at voltage lines 113 and 115 respectively), the voltage driver (107) generates voltages in a first polarity (e.g., negative), including a first de-selection voltage (e.g., 0V at output line 117) responsive to a first control voltage (e.g., 1.2V at control line 111) applied to the voltage driver (107) and a negative selection voltage (e.g., −4V at output line 117) responsive to a third control voltage (e.g., −4V at control line 111) applied to the voltage driver (107).

At block 165, a positive voltage relative to ground is applied to the voltage driver (107). When powered by the positive voltage (e.g., between 5V and 0V at voltage lines 113 and 115 respectively), the voltage driver (107) generates voltages in a second polarity (e.g., positive), including a second de-selection voltage (e.g., 0V at output line 117) responsive to a second control voltage (e.g., 0V at control line 111) applied to the voltage driver (107) and a positive selection voltage (e.g., 4V at output line 117) responsive to a fourth control voltage (e.g., 5V at control line) applied to the voltage driver (107).

At block 167, the voltage driver (107) transitions between the first polarity and the second polarity with switching between the first control voltage and the second control voltage for the voltage driver (107) to output the first de-selection voltage and the second de-selection voltage respective. For example, the transitions are between the configurations illustrated in FIGS. 2 and 4.

At block 169, the voltage driver (107) transitions between the first polarity and the second polarity with switching between the third control voltage and the fourth control voltage for the voltage driver (107) to output the negative selection voltage and the positive selection voltage respective. The voltage driver (107) is configured to experience a first voltage swing between the first control voltage and the second control voltage, and a second voltage swing between the third control voltage and the fourth control voltage, where the first voltage swing is configured to be smaller than a second voltage swing to reduce overall energy consumption in an array (133) of memory cells (e.g., 101) during polarity transition.

For example, the first voltage swing is less than 2V, as illustrated in FIGS. 2 and 4; and the second voltage swing is more than 8V, as illustrated in FIGS. 3 and 5.

For example, the voltage driver (107) is of depletion type. As illustrated in FIGS. 2 and 4, the control voltage swing of the voltage driver (107) is between 1.2V and 0V on control line 111 and thus only about 1.2V for de-selection signals during polarity transition. As illustrated in FIGS. 3 and 5, the control voltage swing of the voltage driver (107) is between −4V and 5V on control line 111 and thus about 9V for selection signals during polarity transition.

The present disclosure includes methods and apparatuses which perform the methods described above, including data processing systems which perform these methods, and computer readable media containing instructions which when executed on data processing systems cause the systems to perform these methods.

The memory device of FIG. 6 can be used in a data processing system.

A typical data processing system may include an interconnect (e.g., bus and system core logic), which interconnects a microprocessor(s) and memory. The microprocessor is typically coupled to cache memory.

The inter-connect interconnects the microprocessor(s) and the memory together and also interconnects them to input/output (I/O) device(s) via I/O controller(s). I/O devices may include a display device and/or peripheral devices, such as mice, keyboards, modems, network interfaces, printers, scanners, video cameras and other devices known in the art. In one embodiment, when the data processing system is a server system, some of the I/O devices, such as printers, scanners, mice, and/or keyboards, are optional.

The inter-connect can include one or more buses connected to one another through various bridges, controllers and/or adapters. In one embodiment the I/O controllers include a USB (Universal Serial Bus) adapter for controlling USB peripherals, and/or an IEEE-1394 bus adapter for controlling IEEE-1394 peripherals.

The memory may include one or more of: ROM (Read Only Memory), volatile RAM (Random Access Memory), and non-volatile memory, such as hard drive, flash memory, etc.

Volatile RAM is typically implemented as dynamic RAM (DRAM) which requires power continually in order to refresh or maintain the data in the memory. Non-volatile memory is typically a magnetic hard drive, a magnetic optical drive, an optical drive (e.g., a DVD RAM), or other type of memory system which maintains data even after power is removed from the system. The non-volatile memory may also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In the present disclosure, some functions and operations are described as being performed by or caused by software code to simplify description. However, such expressions are also used to specify that the functions result from execution of the code/instructions by a processor, such as a microprocessor.

Alternatively, or in combination, the functions and operations as described here can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While one embodiment can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically include one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to non-transitory, recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROM), Digital Versatile Disks (DVDs), etc.), among others. The computer-readable media may store the instructions.

The instructions may also be embodied in digital and analog communication links for electrical, optical, acoustical or other forms of propagated signals, such as carrier waves, infrared signals, digital signals, etc. However, propagated signals, such as carrier waves, infrared signals, digital signals, etc. are not tangible machine readable medium and are not configured to store instructions.

In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by the data processing system.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A device, comprising:
    a plurality of memory cells; and
    a plurality of voltage drivers, each respective voltage driver in the plurality of voltage drivers having a control line, wherein when driving a memory cell among the plurality of memory cells, the respective voltage driver is configured to:
        transition between driving in a first polarity using a negative power voltage relative to ground and driving in a second polarity using a positive power voltage relative to the ground;
        drive, in the first polarity, a first de-selection voltage in response to the control line receiving a first voltage but a negative selection voltage in response to the control line receiving a third voltage; and
        drive, in the second polarity, a second de-selection voltage in response to the control line receiving a second voltage but a positive selection voltage in response to the control line receiving a fourth voltage.

2. The device of claim 1, wherein the respective voltage driver is of depletion type.

3. The device of claim 2, wherein a voltage swing between the first voltage and the second voltage is smaller than a voltage swing between the third voltage and the fourth voltage.

4. The device of claim 3, wherein the negative selection voltage and the positive selection voltage are approximately equal in magnitude relative to the ground.

5. The device of claim 2, wherein a voltage swing between the third voltage and the fourth voltage is substantially equal to a voltage difference between the negative selection voltage and the positive selection voltage.

6. The device of claim 5, comprising:
a cross point memory array containing the plurality of memory cells.

7. The device of claim 6, wherein the memory cell includes a select device.

8. The device of claim 2, wherein the negative selection voltage is substantially equal to the negative power voltage and the third voltage.

9. The device of claim 8, wherein the fourth voltage is substantially equal to the positive power voltage and approximately equal to the positive selection voltage.

10. A method, comprising:
transitioning, by a voltage driver connected to a memory cell, between driving in a first polarity using a negative power voltage relative to ground and driving in a second polarity using a positive power voltage relative to the ground;
driving, by the voltage driver in the first polarity to the memory cell, a first de-selection voltage in response to a control line receiving a first voltage but a negative selection voltage in response to the control line receiving a third voltage; and
driving, by the voltage driver in the second polarity to the memory cell, a second de-selection voltage in response to the control line receiving a second voltage but a positive selection voltage in response to the control line receiving a fourth voltage.

11. The method of claim 10, further comprising:
powering, in the first polarity, the voltage driver using the negative power voltage and the ground; and
powering, in the second polarity, the voltage driver using the positive power voltage and the ground.

12. The method of claim 11, wherein the third voltage is substantially equal to the negative power voltage; and the fourth voltage is substantially equal to the positive power voltage.

13. The method of claim 12, wherein the negative selection voltage is substantially equal to the negative power voltage.

14. The method of claim 12, wherein the positive selection voltage is approximately equal to the positive power voltage.

15. The method of claim 11, wherein a voltage swing between the first voltage and the second voltage is smaller than a voltage swing between the third voltage and the fourth voltage.

16. The method of claim 15, wherein the negative selection voltage and the positive selection voltage are approximately equal in magnitude relative to the ground.

17. The method of claim 11, wherein a voltage swing between the third voltage and the fourth voltage is substantially equal to a voltage difference between the negative selection voltage and the positive selection voltage.

18. A memory device, comprising:
a controller:
first wires configured in parallel in a first layer of an integrated circuit die;
second wires configured in parallel in a second layer of the integrated circuit die;
an array of memory cells configured between the first layer and the second layer, wherein each respective memory cell in the array is at a cross point of one of the first wires and one of the second wires;
first voltage drivers connected to the first wires respectively; and
second voltage drivers connected to the second wires respectively;
wherein when powered by a negative power voltage relative to ground, the respective voltage driver is configured to drive a first de-selection voltage in response to a control line receiving a first voltage but a negative selection voltage in response to the control line receiving a third voltage; and
wherein when powered by a positive power voltage relative to the ground, the respective voltage driver is configured to drive a second de-selection voltage in response to the control line receiving a second voltage but a positive selection voltage in response to the control line receiving a fourth voltage.

19. The memory device of claim 18,
wherein each respective voltage driver in the first voltage drivers and the second voltage drivers is of depletion type.

20. The memory device of claim 18, wherein when the respective memory cell in the array is configured to be selected for a read or write operation when the respective memory cell receives the positive selection voltage and the negative selection voltage via the first wires and the second wires; and the respective memory cell in the array is configured to be de-selected when the respective memory cell receives at least one of the first de-selection voltage and the second de-selection voltage.

* * * * *